United States Patent
Casu et al.

(10) Patent No.: US 11,733,316 B2
(45) Date of Patent: Aug. 22, 2023

(54) POSITION SENSOR HAVING HARMONIC DISTORTION COMPENSATION

(71) Applicant: Allegro MicroSystems, LLC, Manchester, NH (US)

(72) Inventors: Emanuele Andrea Casu, Annecy (FR); Andrea Foletto, Andorno Micca (IT)

(73) Assignee: Allegro MicroSystems, LLC, Manchester, NH (US)

( * ) Notice: Subject to any disclaimer, the term of this patent is extended or adjusted under 35 U.S.C. 154(b) by 151 days.

(21) Appl. No.: 17/120,395

(22) Filed: Dec. 14, 2020

(65) Prior Publication Data

US 2022/0187387 A1 Jun. 16, 2022

(51) Int. Cl.
*G01R 33/00* (2006.01)
*G01D 5/14* (2006.01)

(52) U.S. Cl.
CPC ..... *G01R 33/0017* (2013.01); *G01R 33/0029* (2013.01); *G01D 5/145* (2013.01)

(58) Field of Classification Search
CPC .... G01D 5/12; G01D 5/14–2291; G01D 3/02; G01R 33/0017; G01R 33/0023; G01R 33/0029
See application file for complete search history.

(56) References Cited

U.S. PATENT DOCUMENTS

| | | | |
|---|---|---|---|
| 7,714,570 B2 | 5/2010 | Thomas et al. | |
| 8,786,279 B2 | 7/2014 | Petrie | |
| 9,389,060 B2 | 7/2016 | Romero et al. | |
| 9,739,847 B1 | 8/2017 | Alpago et al. | |
| 10,120,042 B2 | 11/2018 | Diaconu et al. | |
| 10,145,908 B2 | 12/2018 | David et al. | |
| 10,585,147 B2 | 3/2020 | Romero | |
| 10,670,672 B2 | 6/2020 | David et al. | |
| 11,047,679 B2* | 6/2021 | Mori | G01D 5/2053 |
| 2004/0095089 A1* | 5/2004 | Collier-Hallman | B62D 5/046 318/567 |
| 2009/0115408 A1* | 5/2009 | West | G01D 5/2449 324/207.25 |
| 2014/0139217 A1* | 5/2014 | Vaysse | G01D 5/204 324/318 |

(Continued)

FOREIGN PATENT DOCUMENTS

| | | |
|---|---|---|
| DE | 10 2016 220 188 A1 | 4/2018 |
| DE | 10 2019 115 787 B3 | 10/2020 |

OTHER PUBLICATIONS

Extended European Search Report dated Feb. 15, 2022 for European Application No. 21196129.7; 9 Pages.

(Continued)

*Primary Examiner* — Huy Q Phan
*Assistant Examiner* — David B Frederiksen
(74) *Attorney, Agent, or Firm* — Daly Crowley Mofford & Durkee, LLP

(57) ABSTRACT

Methods and apparatus for determining a mechanical angle of a target from sine and cosine signals generated by inductive sensing elements by applying harmonic compensation on the sine and cosine signals using possible mechanical angles and analyzing results of the applied harmonic compensation. One of the mechanical angles can be selected based on the results of the applied harmonic compensation. In embodiments, a cost function can be used to select the mechanical angle.

29 Claims, 12 Drawing Sheets

(56) References Cited

U.S. PATENT DOCUMENTS

| | | | |
|---|---|---|---|
| 2014/0347040 A1* | 11/2014 | Kawase | G01D 5/2448 |
| | | | 324/207.12 |
| 2016/0372971 A1* | 12/2016 | Budde | H02M 1/12 |
| 2017/0356762 A1* | 12/2017 | David | G01B 7/023 |
| 2017/0356967 A1* | 12/2017 | Romero | G01R 33/0029 |
| 2018/0052009 A1* | 2/2018 | Kim | G01D 5/145 |
| 2019/0031046 A1* | 1/2019 | Secrest | H02P 6/16 |
| 2019/0271568 A1* | 9/2019 | Kozomora | G01R 33/072 |
| 2019/0310148 A1* | 10/2019 | Bertin | G01L 5/221 |
| 2020/0088546 A1 | 3/2020 | Sirohiwala et al. | |
| 2020/0132874 A1* | 4/2020 | Witts | H01F 21/10 |
| 2020/0348151 A1* | 11/2020 | Huber Lindenberger | |
| | | | G01R 33/0029 |
| 2022/0140759 A1* | 5/2022 | Knezevic | H02P 6/18 |
| | | | 318/558 |

OTHER PUBLICATIONS

U.S. Appl. No. 16/657,032, filed Oct. 18, 2019, Aguirre et al.
U.S. Appl. No. 17/082,151, filed Oct. 28, 2020, Drouin.
U.S. Appl. No. 17/097,498, filed Nov. 13, 2020, Casu et al.
U.S. Appl. No. 17/097,533, filed Nov. 13, 2020, Gillet et al.
U.S. Appl. No. 17/160,573, filed Jan. 28, 2021, Daubert et al.
Response to Extended European Search Report (EESR) dated Feb. 15, 2022 for European Application No. 21196129.7; Response filed Dec. 15, 2022; 11 Pages.

* cited by examiner $\theta$el =atan2(Sine/Cosine)

|  | SINE | | COSINE | |
| --- | --- | --- | --- | --- |
| Mechanical harmonic | Amplitude | Phase | Amplitude | Phase |
| 1 | 0.02 | 3.53E-14 | 2.59E-17 | 2.38E+02 |
| 2 | 0.0025 | 360 | 0.006 | 71 |
| 3 | 0.05 | 345 | 0.025 | 51 |
| 4 | 0.125 | 355 | 0.15 | 76 |
| 5 | 1 | 270 | 1 | 1 |
| 6 | 0.124606 | 184.9681 | 0.15 | 286 |
| 7 | 0.04995 | 195 | 0.024972 | 311.4079 |
| 8 | 0.0015 | 180 | 0.005929 | 298.1771 |
| 9 | 0.017543 | 178.582 | 0.0045 | 55 |
| 10 | 0.02 | 285 | 0.03 | 340 |
| 11 | 0.002307 | 198.7145 | 0.0045 | 265 |
| 12 | 0.000975 | 209.872 | 0.00063 | 290 |
| 13 | 0.00045 | 20.5546 | 0.00032 | 90 |
| 14 | 0.00087 | 36.83571 | 0.003 | 115 |
| 15 | 0.01 | 305 | 0.02 | 40 |
| 16 | 0.001104 | 226.6853 | 0.003 | 325 |
| 17 | 0.000484 | 232.2662 | 0.00053 | 350 |
| 18 | 0.000484 | 342.7338 | 0.000245 | 330 |
| 19 | 0.001104 | 348.3147 | 0.00075 | 355 |
| 20 | 0.01 | 270 | 0.005 | 280 |
| 21 | 0.00125 | 185 | 0.00075 | 205 |

FIG. 7A

| K | Sine $C_K$ | Cosine $C_K$ |
|---|---|---|
| 0 | 0.721137 | 0.706401 |
| 1 | 0.730973 | 0.754867 |
| 2 | 0.617919 | 0.601326 |
| 3 | 0.116948 | 0.148924 |
| 4 | 0.563284 | 0.541015 |

FIG. 7C

POSITION SENSOR HAVING HARMONIC DISTORTION COMPENSATION

BACKGROUND

As is known in the art, inductive sensors, such as rotary sensors, can be provided as an angle sensor for detecting the position or speed of a rotating target. In particular, inductive rotary sensors can be used to detect the position of a gear or another moving element in a mechanical system. They are frequently used in automated control applications, such as automated control applications in automobiles or industrial equipment, for example. As is also known harmonic components may decrease sensor accuracy.

SUMMARY

Example embodiments of the disclosure provide methods and apparatus for detecting unambiguous mechanical angle position of multi-pole angle sensors with analog sine/cosine outputs which contain information of the single pole-pair angle (electrical angle). Embodiments of the disclosure are applicable to multi-pole angle sensors in general in which enhanced angle sensing is desirable. In some embodiments, sensor embodiments comprise inductive eddy current angle sensors. Signal processing of sensed signals can be performed in the sensor integrated circuit (IC) package, an IC interfaced to the sensor, remote circuit board, or the like, that receives the analog signals from the sensing elements.

In embodiments, harmonic content of the sine/cosine signals is known and has been stored, such as in memory. Where the harmonic content is known, a mechanical reference is determined by applying harmonic coefficients with mechanical angle guess(es) and performing a Fourier Transform, such as a discrete Fourier transform (DFT). The mechanical angle that provides minimum harmonic content in the DFT results can be selected.

In some multi-pole inductive position sensors, the electrical angle includes errors that can be related to a specific pole and, therefore, to the mechanical absolute position. Having the mechanical angle information or knowing on which pole is the sensor, the host system can apply further corrections to have a more accurate angle information. In many electric motor applications with multi poles, there may be some mechanical tolerance or imperfection in the motor design related to a specific pole (for example due to bended teeth/runout/manufacturing tolerances, etc.), making the angle calculation less accurate. Knowing the absolute angle allows for additional compensation and enhanced accuracy.

In embodiments, an IC or host calculates electrical angle $\theta el$ using sine and cosine analog signals with the following formula: $\theta el = a\tan 2(Sine/Cosine)$ and applies harmonic compensation on the sine and cosine signals N times using the N possible mechanical angle ($\theta m$) position values spaced by 360 electrical degree: $\theta m = \theta el/N + k*360/N$ where k can vary from 0 to N−1. A set of N pairs of sine and cosine compensated signals is obtained. On each of the N compensated signals a DFT can be performed using estimated mechanical angle as a reference for sampling at uniform intervals. At the end of a full mechanical revolution (equal to N electrical periods) without direction change, the DFT providing a minimum cost, for example, of higher order harmonics, e.g., except the desired first electrical harmonic (Nth mechanical harmonic), identifies the proper mechanical angle for correct harmonic compensation.

In one aspect, a method comprises: determining a mechanical angle of a target from sine and cosine signals generated by sensing elements; applying harmonic compensation on the sine and cosine signals for possible mechanical angles; analyzing results of the applied harmonic compensation; and selecting one of the mechanical angles for harmonic compensation of the sine and cosine signals based on the results of the applied harmonic compensation.

A method can further include one or more of the following features: the sensing elements comprise inductive sensing elements, the sensing elements comprise magnetic sensing elements, the sine and cosine signals are generated by a transmit coil and at least two receiving coils, analyzing the results includes using a cost function, selecting one of the mechanical angles comprises selecting the mechanical angle with the lowest value from the cost function, applying the harmonic compensation on the sine and cosine signals includes performing a Fourier transform, the harmonic compensation for the mechanical angles is stored, determining the harmonic compensation information over at least one mechanical revolution of a target at constant speed and/or using an absolute angle reference, the sensing elements comprise part of a multi-pole angle sensor IC package, the sensor IC package comprises an inductive eddy current angle sensor, the possible mechanical angles are defined by $$\theta m = \frac{\theta el}{N} + k*360/N$$

where k can vary from 0 to N−1, $\theta m$ refers to mechanical angle, $\theta el$ refers to electrical angle, and N refers to a number of teeth on the target, and/or the results of the applied harmonic compensation include amplitudes of undesired harmonic components.

In another aspect, a system comprises: an integrated circuit (IC) package including circuitry to: receive sine and cosine signals from sensing elements; apply harmonic compensation on the sine and cosine signals for possible mechanical angles of a target; analyze results of the applied harmonic compensation; and select one of the mechanical angles for harmonic compensation of the sine and cosine signals based on the results of the applied harmonic compensation.

A system can further include the sensing elements comprise inductive sensing elements, the sensing elements comprise magnetic field sensing elements, the sine and cosine signals are generated by a transmit coil and at least two receiving coils, the results are analyzed using a cost function, one of the mechanical angles is selected based on a lowest value from the cost function, applying the harmonic compensation on the sine and cosine signals includes performing a Fourier transform, the harmonic compensation for the mechanical angles is stored, the harmonic compensation information is determined over at least one mechanical revolution of a target at constant speed and/or using an absolute angle reference, the sensing elements comprise part of a multi-pole angle sensor IC package, the sensor IC package comprises an inductive eddy current angle sensor, the possible mechanical angles are defined by $$\theta m = \frac{\theta el}{N} + k*360/N$$

where k can vary from 0 to N−1, $\theta m$ refers to mechanical angle, $\theta el$ refers to electrical angle, and N refers to a number of teeth on the target, the results of the applied harmonic compensation include amplitudes of undesired harmonic components, a sensor IC package containing the sensing elements, wherein the sensor IC package is coupled to the IC package, and/or the IC package comprises and engine control unit.

In a further aspect, a system comprises: means for receiving sine and cosine signals from sensing elements; and means for processing the sine and cosine signals including: applying harmonic compensation on the sine and cosine signals for possible mechanical angles of a target; analyzing results of the applied harmonic compensation; and selecting one of the mechanical angles for harmonic compensation of the sine and cosine signals based on the results of the applied harmonic compensation.

BRIEF DESCRIPTION OF THE DRAWINGS

The foregoing features of this invention, as well as the invention itself, may be more fully understood from the following description of the drawings in which:

FIG. 7A is a tabular representation of example amplitude and phase data for mechanical harmonic components for an illustrative sensor;

FIG. 7C is a tabular representation of results from a cost function applied to example compensation sine and cosine signals;

DETAILED DESCRIPTION

Example embodiments of the disclosure provide a sensor, such a magnetic field sensor or an inductive sensor having coils, such as a transmit coil and a receive coil(s), with mechanical angle detection using harmonic component information. A target having one or more teeth, e.g., N>=1, can be fixed to a rotatory shaft, for example. A signal injected by the transmit coil results in the receiving coil(s) sensing a signal at the carrier frequency of the signal transmitted by the transmit coil. A sinusoidal amplitude modulation of the received signal is dependent upon the angular position of the target. Harmonic information, which may be stored, can be used to remove distortion from higher order harmonic components to increase sensor accuracy.

Figure 1:
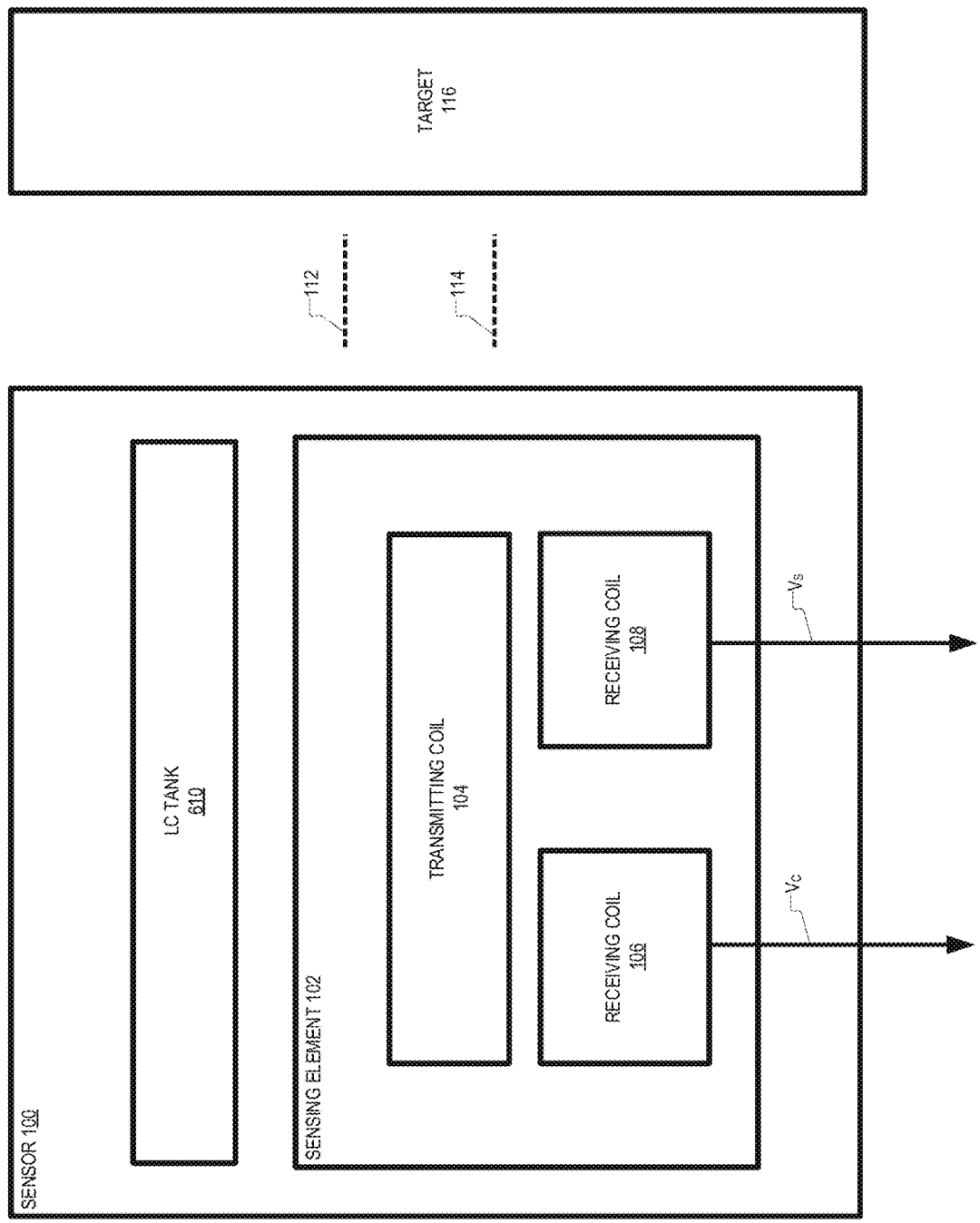
FIG. 1 is a block diagram of an example inductive position sensor system having harmonic distortion compensation in accordance with illustrative embodiments of the disclosure.

FIG. 1 shows an example inductive sensor 100 for position sensing having mechanical angle detection in accordance with example embodiments of the disclosure. The sensor 100 includes a sensing element 102 having a transmitting coil 104 and at least first and second receiving coils 106, 108. As illustrated, the sensor 100 may also include an LC tank 110 that is configured to drive the transmitting coil 104. In operation, the LC tank 110 may cause the transmitting coil 104 to transmit a direct magnetic field 112 that may induce a second magnetic field 114 (hereinafter "reflected magnetic field 114") in a target 116. The receiving coils 106 and 108 may receive the reflected magnetic field 114 and output cosine Vc and sine Vs signals, respectively.

The sine and cosine signals Vc and Vs may be described below:

$$V_c = K_1 \cos(\theta_{el}) * \sin(2\pi f_r t)$$

$$V_S = K_2 \sin(\theta_{el}) * \sin(2\pi f_r t)$$

where, $K_1$ is a coupling coefficient associated with the first receiving coil 106, $K_2$ is a coupling coefficient for the second receiving coil 108, $\theta_{el}$ is the electrical angle of the target 116 in the target's electrical period, $f_r$ is the resonant frequency of the LC tank 110, and t is time. It is understood that the carrier signal is contained in the $\sin(2\pi f_r t)$ portion and the signal envelop containing the angular information is contained in $K_1 \cos(\theta_{el})$.

According to the present disclosure, the electrical angle of the target 116 indicates the angular position of the target in its electrical period. The coupling coefficient $K_1$ indicates the proportion of the flux of the reflected magnetic field 114 that is sensed by the first receiving coil 106. And the coupling coefficient $K_2$ indicates the proportion of the magnetic flux of the reflected magnetic field 114 that is sensed by the second receiving coil 108. In other words, the coupling coefficients may indicate the proportion of energy transmitted by the target 116 that is received by the first and second receiving coils 106, 108.

When N=1, the envelop of the received signal represents the sine and cosine information of the mechanical angle. When N>1, the envelop represents the sine and cosine of the electrical angle ($\theta_{el}$). In one mechanical revolution of the target (360 degrees), there are N electrical rotations (N*360). The electrical angle can be defined as $$\theta el = \mathrm{atan2}\left(\frac{\sin}{\cos}\right).$$

The mechanical angle may be ambiguous and defined as $$\theta m = \frac{\theta el}{N+k} * 360/N,$$

where k can vary. The electrical angle of the target 116 may be based on the mechanical angle of the target (with respect to the sensor 100) and the number of lobes in each portion of the receiving coils 106, 108. According to the present disclosure, the mechanical angle of the target 116 indicates the orientation of the target 116 relative to the sensor 100 and/or the sensing element 102.

It is understood that a variety of sensing element types can be used to generate sine and cosine signals for which it may be desirable to identify an ambiguous mechanical angle. Example sensors generating sine and cosine signals for which mechanical angle identification may be performed in accordance with embodiments of the disclosure include U.S. Pat. Nos. 7,714,570, 8,786,279, 9,739,847, and 10,585,147, all of which are incorporated herein by reference.

Figure 2:
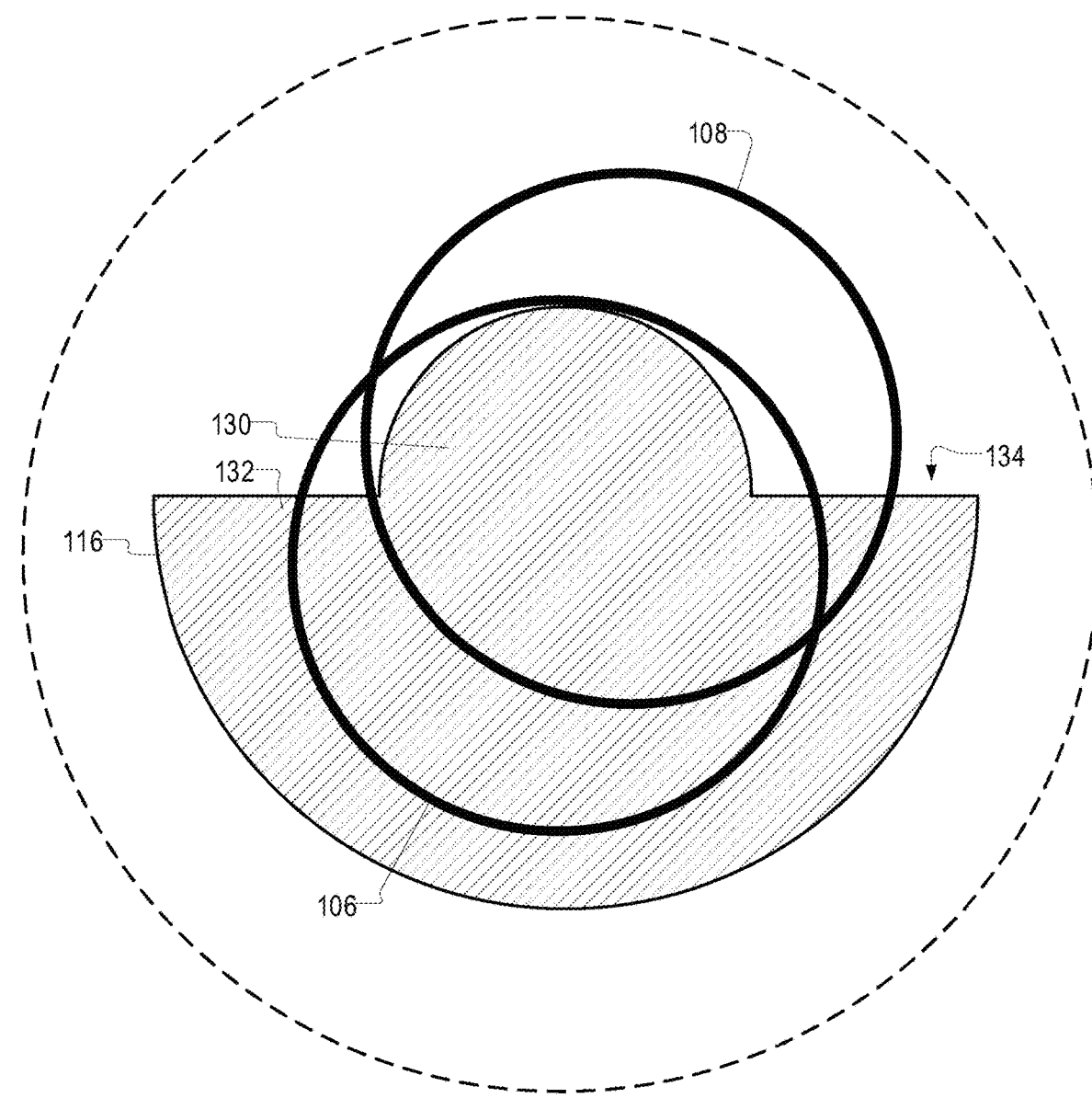
FIG. 2 is a top view of an example system including a sensing element and a target, according to aspects of the disclosure.

FIG. 2 is a schematic diagram of an example implementation of the sensing element 102 of FIG. 1. As illustrated, in the example of FIG. 1, the sensing element 102 includes a receiving coil that is used to measure the speed (and/or angular displacement) of a target 116. The receiving coil may include a first coil portion 106 and a second coil portion 108. The first coil portion 106 and the second coil portion 108 may include 1 lobe each. The target 116 may have a main portion 130, a tooth 132, and a valley 134. As illustrated, the tooth 132 and the valley 134 may each have a respective arc length that is equal to 180 degrees.

Figure 3:
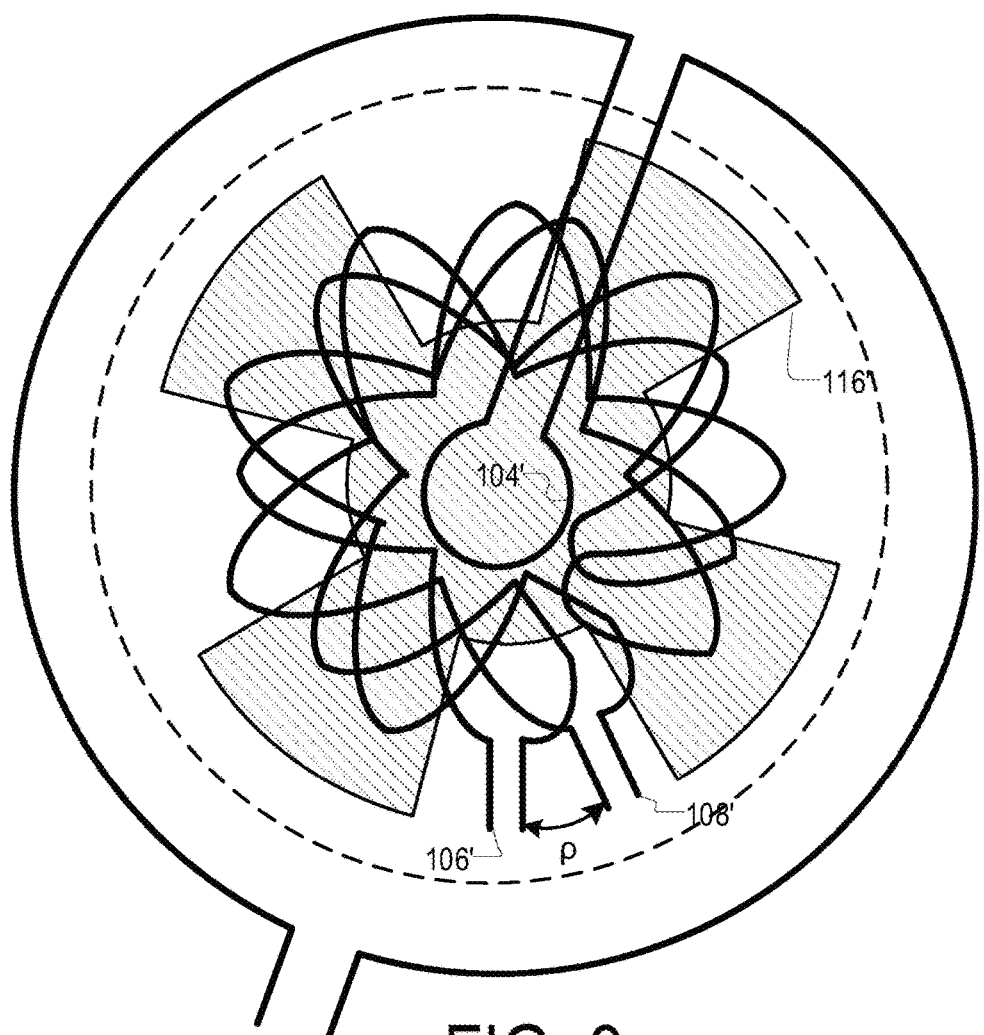
FIG. 3 is a top view of a further example system including a sensing element and a target, according to aspects of the disclosure.

FIG. 3 shows an example sensing element 102' having a target where N=4. In some implementations, the number of teeth in the target of the system may be equal to the number of lobes in each coil portion of the receiving coils of the system. According to the example of FIG. 3, the target 116' of the sensing element has four (4) teeth, the first coil portion of the receiving coil 106' may have four (4) lobes and the second coil portion of the receiving coil 108' may have four (4) lobes. The sensing element 102' may be used to measure the rotational displacement and/or speed of the target 116'.

Figure 4:
FIG. 4 is a side view of the example position sensor of FIG. 2 according to aspects of the disclosure.

FIG. 4 shows an example implementation of a sensing element, such as the sensing element 102 of FIG. 1. As can be seen, the transmit coil 104, the first receiving coil 106, and the second receiving coil 108 are provided in PCB layers in an example stack up. The target 116 is positioned a given distance from the sensor 100.

Figure 5:
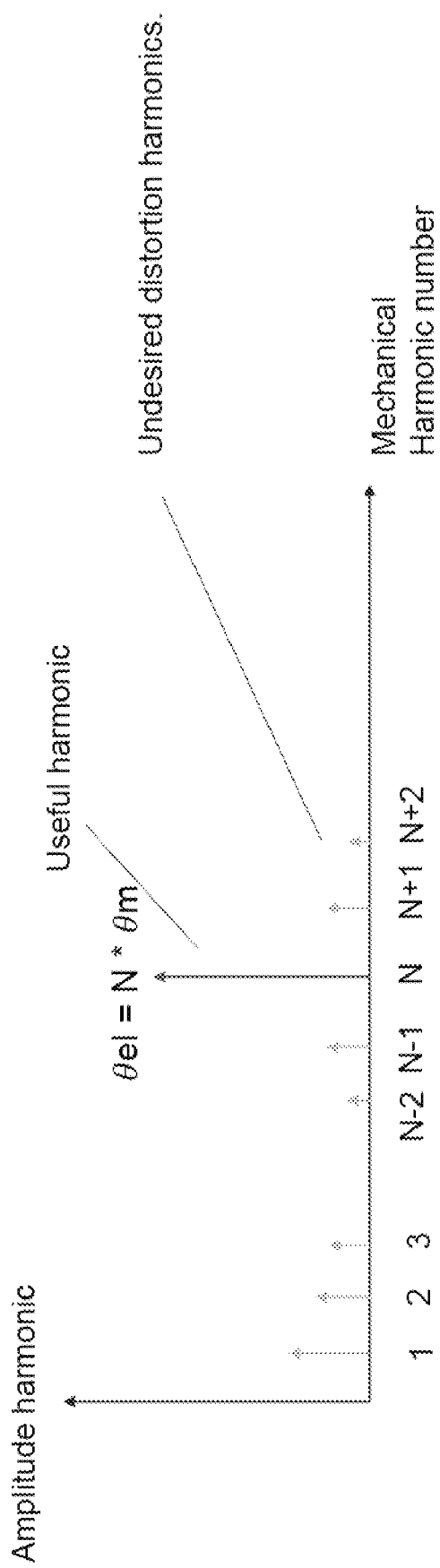
FIG. 5 is a waveform diagram showing harmonic component amplitude over harmonic number for an example angle sensor.

As shown in FIG. 5, undesirable harmonic frequencies can reduce accuracy of sensors. In general, signals from the receiving coils are not ideal sine and cosine waveforms for the electrical angle of the target. In addition to the desired first electrical harmonic, higher order harmonic components may be present. As can be seen, mechanical harmonic number can be plotted versus harmonic amplitude. The signal of interest for the mechanical harmonic is θ(el)=N*θ(m). Harmonic components at N+/−1, N+/−2, etc., are undesirable since they reduce the accuracy of the sensor by generating an error in the electrical angle information.

Figure 6A:
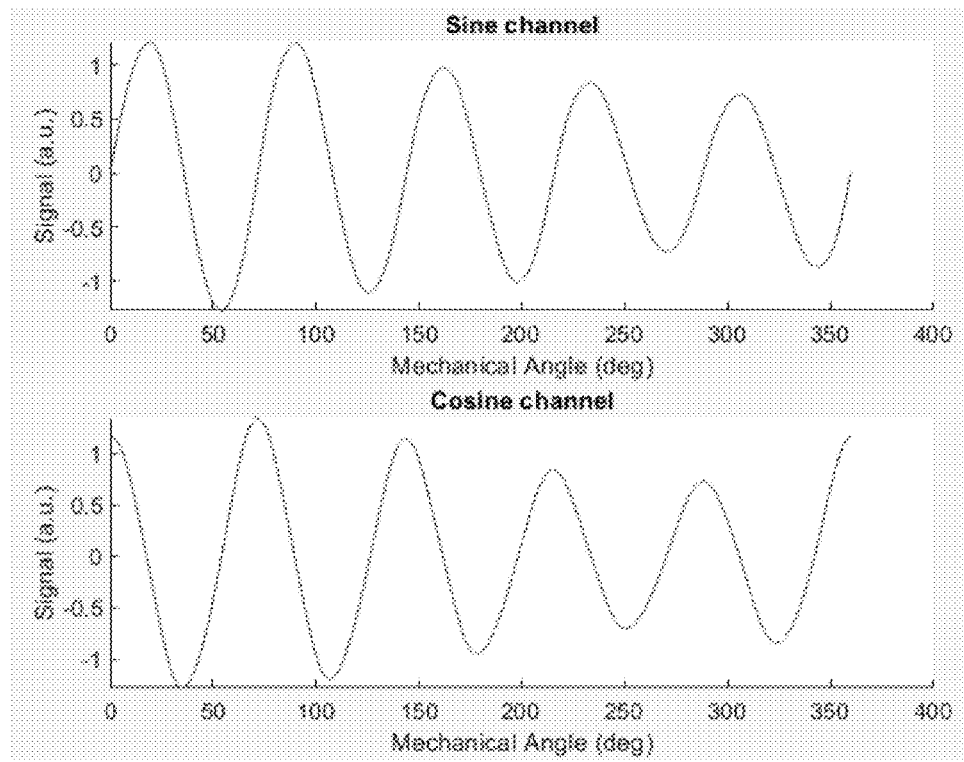
FIG. 6A shows example sine and cosine waveforms for an illustrative sensor.
Figure 6B:
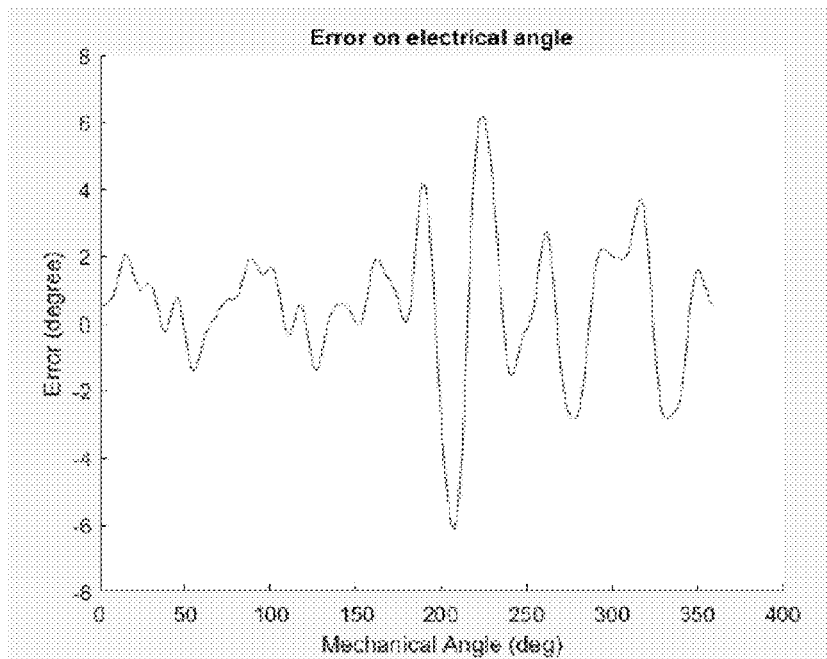
FIG. 6B shows an example waveform of the electrical angle error over mechanical angle for the waveforms of FIG. 6A.

FIG. 6A shows an example received sine signal over mechanical angle with harmonic distortion and an example received cosine signal over mechanical angle with harmonic distortion. In the illustrated waveforms N=5. FIG. 6B shows electrical angle error over mechanical angle for the sine and cosine signals of FIG. 6A. The electrical angle error over mechanical angle provides a signature for the harmonic distortion. As described more fully below, the electrical angle error can be used to identify the mechanical angle.

In embodiments, undesired harmonic components that generate error in the angular position can be removed if the harmonic components of the sine and cosine signals, e.g., amplitude $A_i$ and phase $\varphi_i$ and the reference mechanical angle for the harmonic component phase are known. If these are known, the corrected sine and cosine signals can be obtained by subtracting out the undesired harmonic components. This can be expressed as:

SineCorrected=Sine−$\Sigma_i A_i \sin(i*\theta_m+\varphi_m)$

CosineCorrected=Cosine−$\Sigma_i A_i \sin(i*\theta_m+\varphi_m)$

Obtaining harmonic information can be performed in a variety of ways. For example, harmonic components can be determined by using a Discrete Fourier Transform (DFT) for target rotating at a constant speed over at least one mechanical cycle, e.g., 360 degrees. Also, harmonic components can be determined using an absolute reference angle during calibration, for example. It is understood that any practical technique can be used to obtain harmonic component information to meet the needs of a particular application. Once obtained, the harmonic component information can be stored and used to remove harmonic-based error, as described more fully below.

Figure 7:
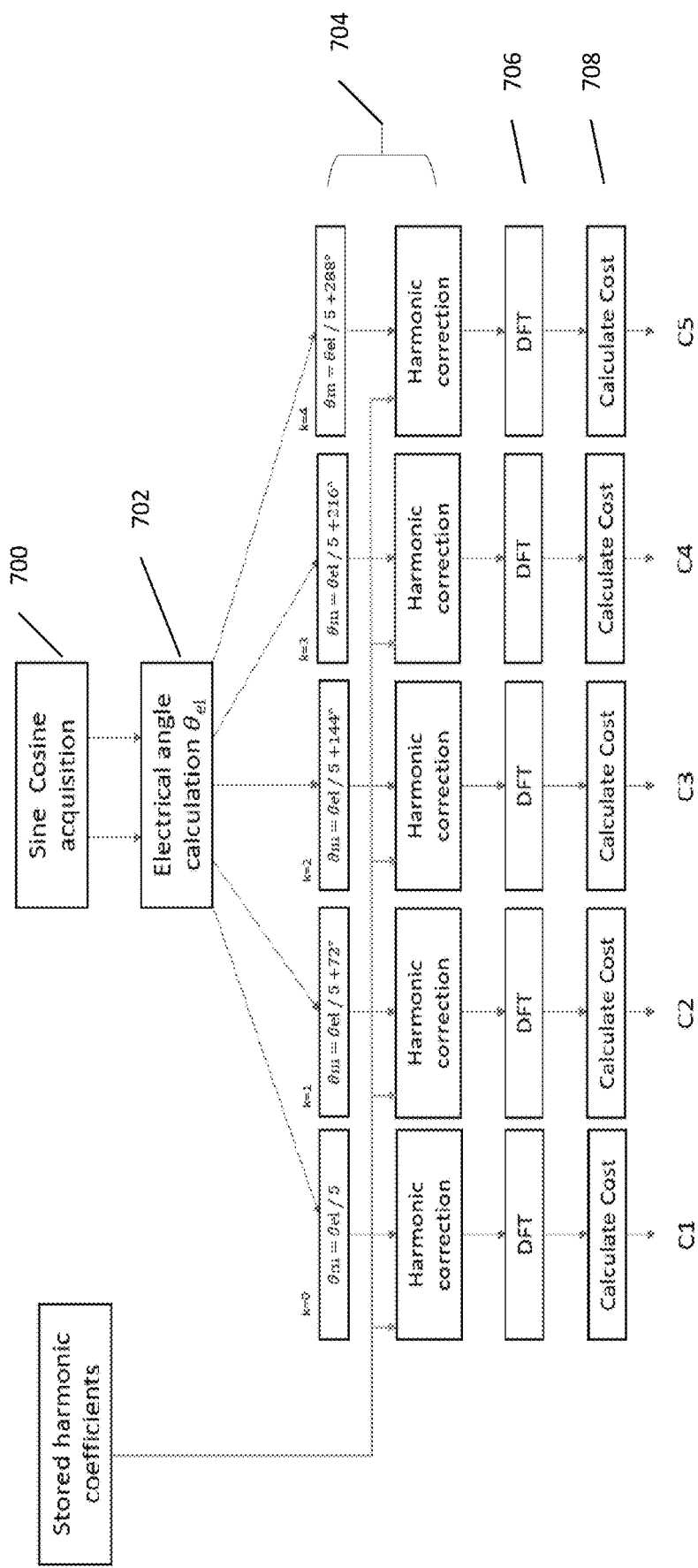
FIG. 7 is a representation of processing for determining mechanical angle from harmonic information.
Figure 7B:
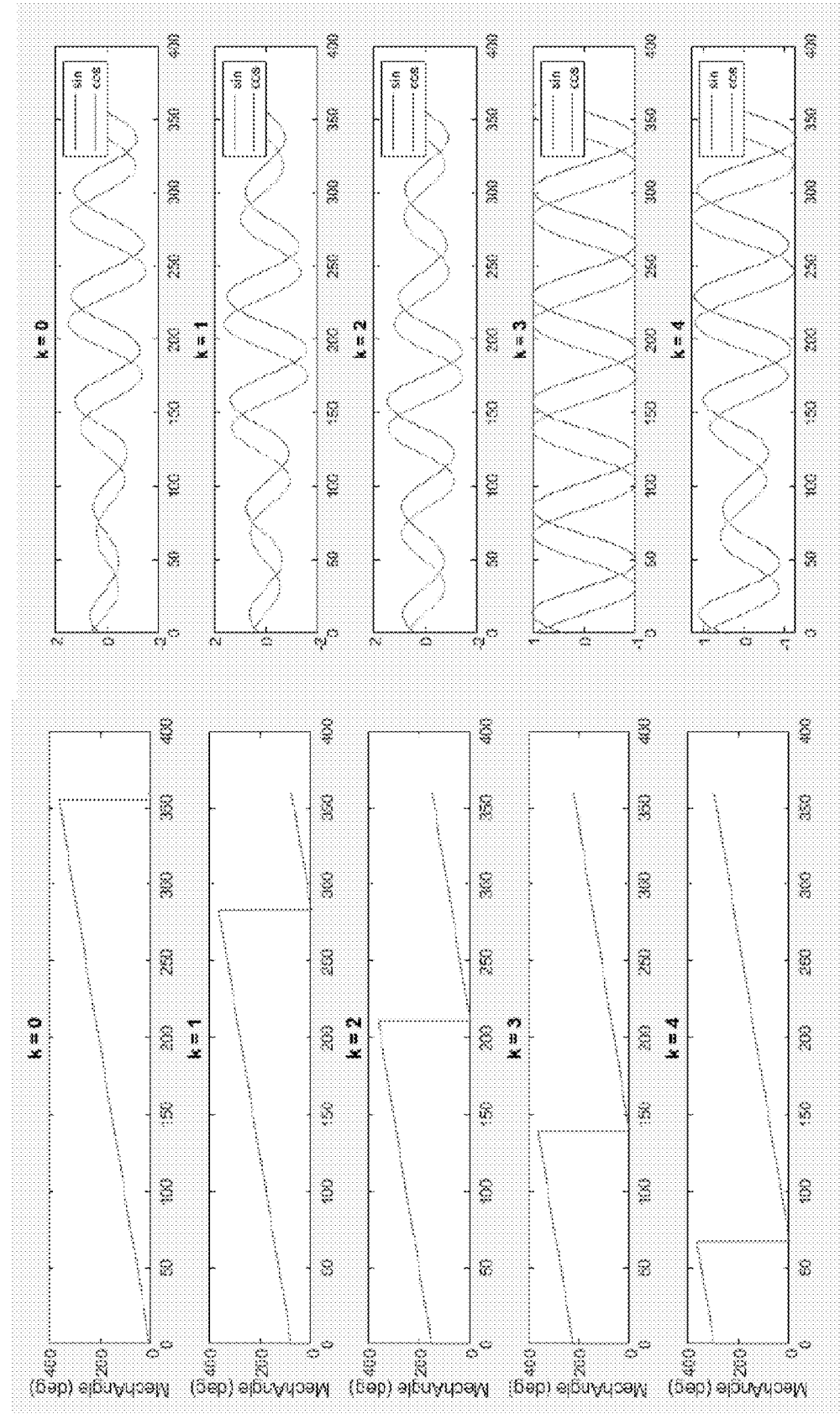
FIG. 7B shows possible mechanical angles for N=5 and k=0 to 4 and corresponding example compensated sine and cosine signals.
Figure 7D:
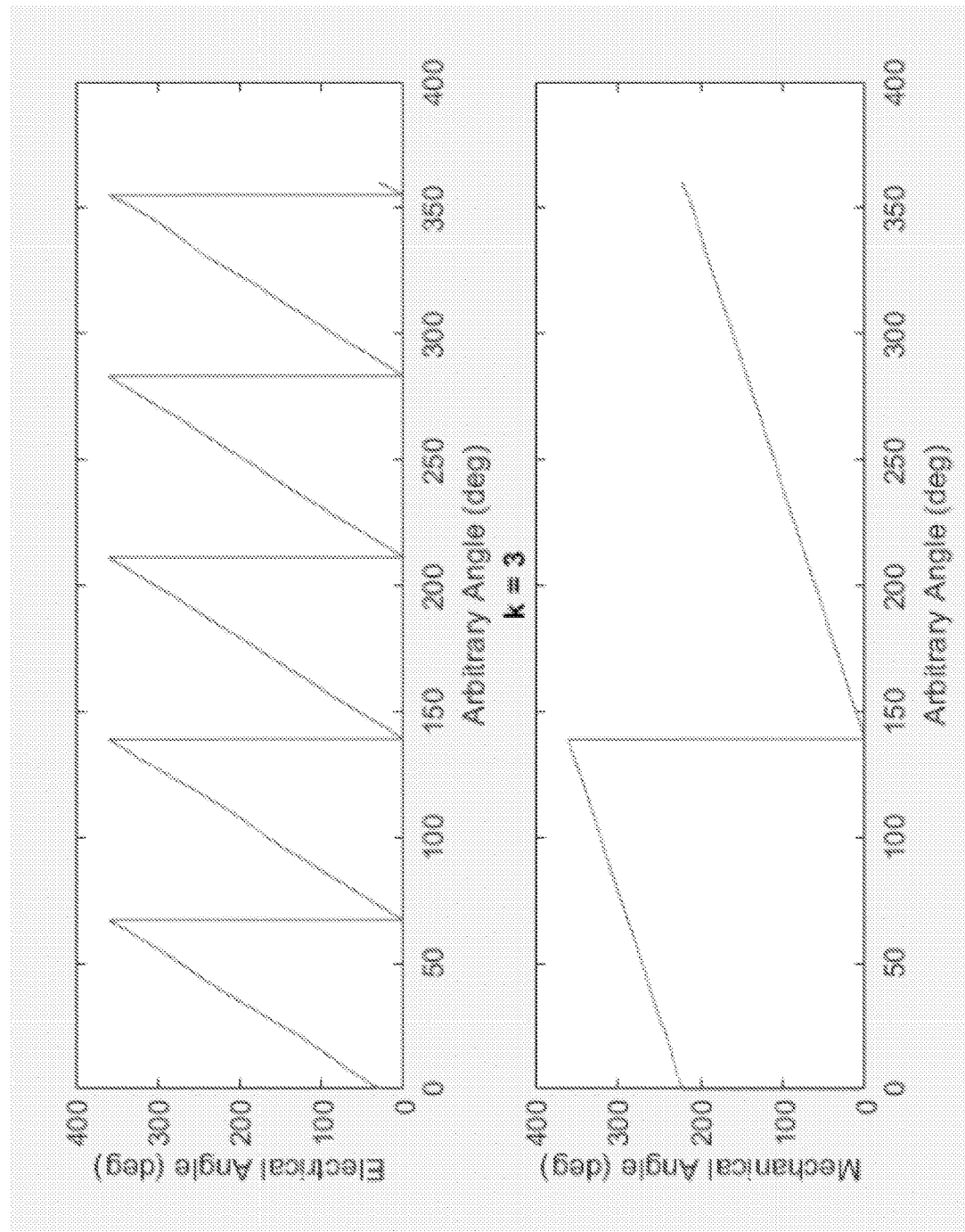
FIG. 7D shows example waveforms for electrical angle over arbitrary mechanical angle and mechanical angle for an arbitrary angle for k=3.

FIG. 7 shows example processing to perform harmonic processing in accordance with example embodiments of the disclosure. In the illustrative embodiment, N=5. In step 700, sine and cosine signals are acquired, which may be similar to the signals shown in FIG. 6A. FIG. 7A shows example harmonic amplitude and phase information for a series of mechanical harmonics. In embodiments, the signals of FIG. 6A and harmonic information in FIG. 7A are used for calibration. The harmonic data can be stored to perform harmonic distortion compensation. FIG. 7B shows an estimated mechanical angle on the left side for each of k=0 to 4 and corrected sine and cosine signals for each value of k on the right side. As can be seen, k=3 is the value to select for finding the reference for mechanical angle reconstruction and harmonic compensation. FIG. 7C shows a sum of the harmonic amplitudes for k=0 to 4. As can be seen, k=3 has the lowest cost value. FIG. 7D shows electrical angle and reconstructed mechanical angle for starting period k=3.

In step 702, the electrical angle θel is calculated from sine and cosine signals, such as from receiving coils. In embodiments, electrical angle θel is calculated as:

$$\theta el = \mathrm{atan2}\left(\frac{\sin}{\cos}\right)$$

It is understood that the sine and cosine signals are raw signals that include harmonic distortion so that the electrical angle θel has error due to the harmonic components.

In step 704, harmonic compensation is applied to the sine and cosine signal N times using N possible mechanical angles, which can be expressed as:

$$\theta m = \frac{\theta el}{N} + k*360/N$$

where k can vary from 0 to N−1.

A set of N pairs of compensated sine and cosine signals are obtained. In step 706, a DFT can be performed on the signals using estimated angle as a reference for sampling at uniform intervals. The output of the DFT is the harmonic content of the corrected signals in amplitude and phase.

In embodiments, at end of a full mechanical revolution (equal to N electrical periods) without direction change, in step 708 the DFT providing a minimum cost of all harmonic expect the first electrical harmonic (Nth mechanical harmonic) identifies the proper mechanical angle for correct harmonic compensation. The cost function can be defined as the sum by summing up harmonic component magnitudes (except fundamental):

$$C_k = H_{M1} + H_{M2} + H_{M3} + \ldots + H_{N-1} + H_{N+1} + \ldots + H_{2N}$$

where $H_{Mx}$ is the amplitude of x mechanical harmonics, and calculated harmonics are summed except for the system desired harmonic ($H_N$). When the mechanical angle used for compensation (number of k shifts of 360 electrical degree) corresponds to the same one as the one the stored harmonic content, the cost function has its minimum. Once the mechanical angle reference is known, the IC or host can use it memory or for other applications to apply the harmonic compensation on the signals with the stored harmonic information. The procedure can be applied in parallel or in series.

It is understood that any suitable cost function can be used to meet the needs of a particular application. For example, a root mean squared of harmonic amplitudes can be used.

In embodiments, a sensor system can include an interface IC to drives the sensor by providing the carrier signal to the transmitting (primary coil) and receives and conditions the signals from the receiving coils and transmit them to a host. The interface IC can calculate the electrical angle information to transmit it to the host. The host may include a microcontroller, an engine control unit (ECU), or the like, that receives the conditioned signals or the electrical angular information from the Interface IC. This information can be transmitted in analog or digital forms. The sensor and the interface IC may be configured to provide the host with accurate electrical angle information.

Figure 8:
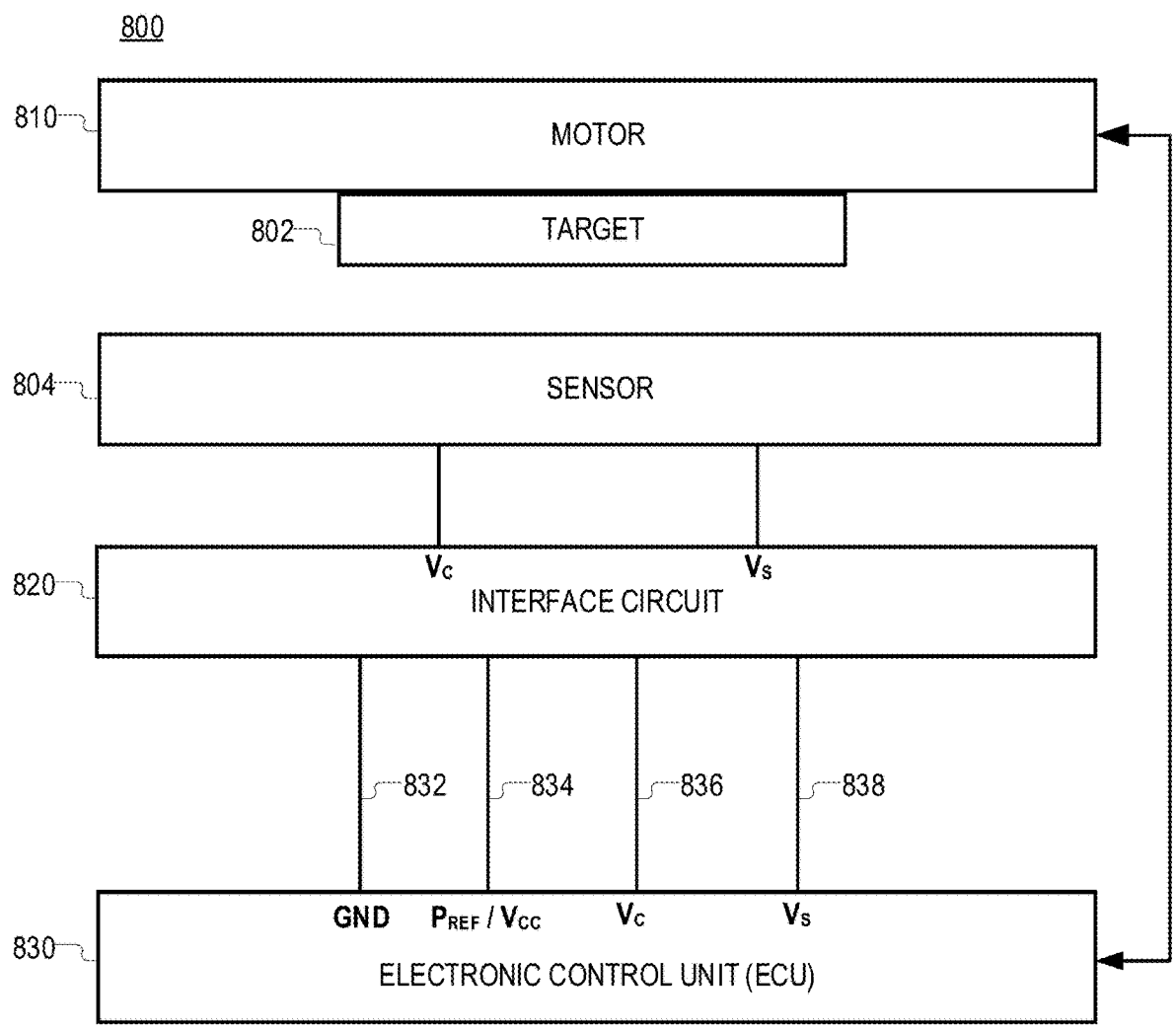
FIG. 8 is a block diagram of an example sensor system including an ECU.

FIG. 8 is a diagram of an example of a system 800, according to aspects of the disclosure. As illustrated, the system 800 may include an electric motor 810, a target 802, a sensor 804, an interface circuit 820, and an electronic control unit (ECU) 830. The target 802 may be coupled to a rotor of the electric motor 810 (not shown), and it may rotate with the rotor. The sensor 804 may detect the rotation of the target 802 and output signals $V_c$ and $V_s$ to the interface circuit 820 after harmonic compensation, as described above. The interface circuit 820 may be coupled to the ECU 830 via lines 832-838. Line 832 may be used by the ECU 830 to provide ground to the interface circuit 820. Line 834 may be used by the ECU 830 to provide power to the interface circuit. Line 836 may be used by the interface circuit 820 to provide the signal $V_c$ to the ECU 830. And line 838 may be used by the interface circuit 820 to provide the signal $V_s$ to the ECU 830. Based on the signals $V_c$ and $V_s$, the ECU 830 may determine the electric angle $\theta_{el}$ of the target 300, in accordance with Equation 8 below.

$$\theta_{el} = \arctan\left(\frac{V_s}{V_c}\right) \quad (8)$$

The electrical angle $\theta_{el}$ of the target 802 may be used by the ECU 830 to determine the speed and/or mechanical angle of the target 802. Based on the speed and/or mechanical angle of the target 802, the ECU 830 may adjust the speed of (or stop) the electric motor 810. It will be understood that the present disclosure is not limited to any specific method for using the speed and/or mechanical angle of the target 802. Although in the example of FIG. 8 the sensor 804 is used to control the speed of an electric motor, it will be understood that the present disclosure is not limited to any specific application of the sensor 804. For example, the sensor 804 can be used to control shifting in automotive transmissions and/or any other suitable application. In this regard, although in the example of FIG. 8 the interface circuit 820 is coupled to an ECU, it will be understood that alternative implementations are possible in which the interface circuit 820 is coupled to another type of electronic circuitry.

Figure 9:
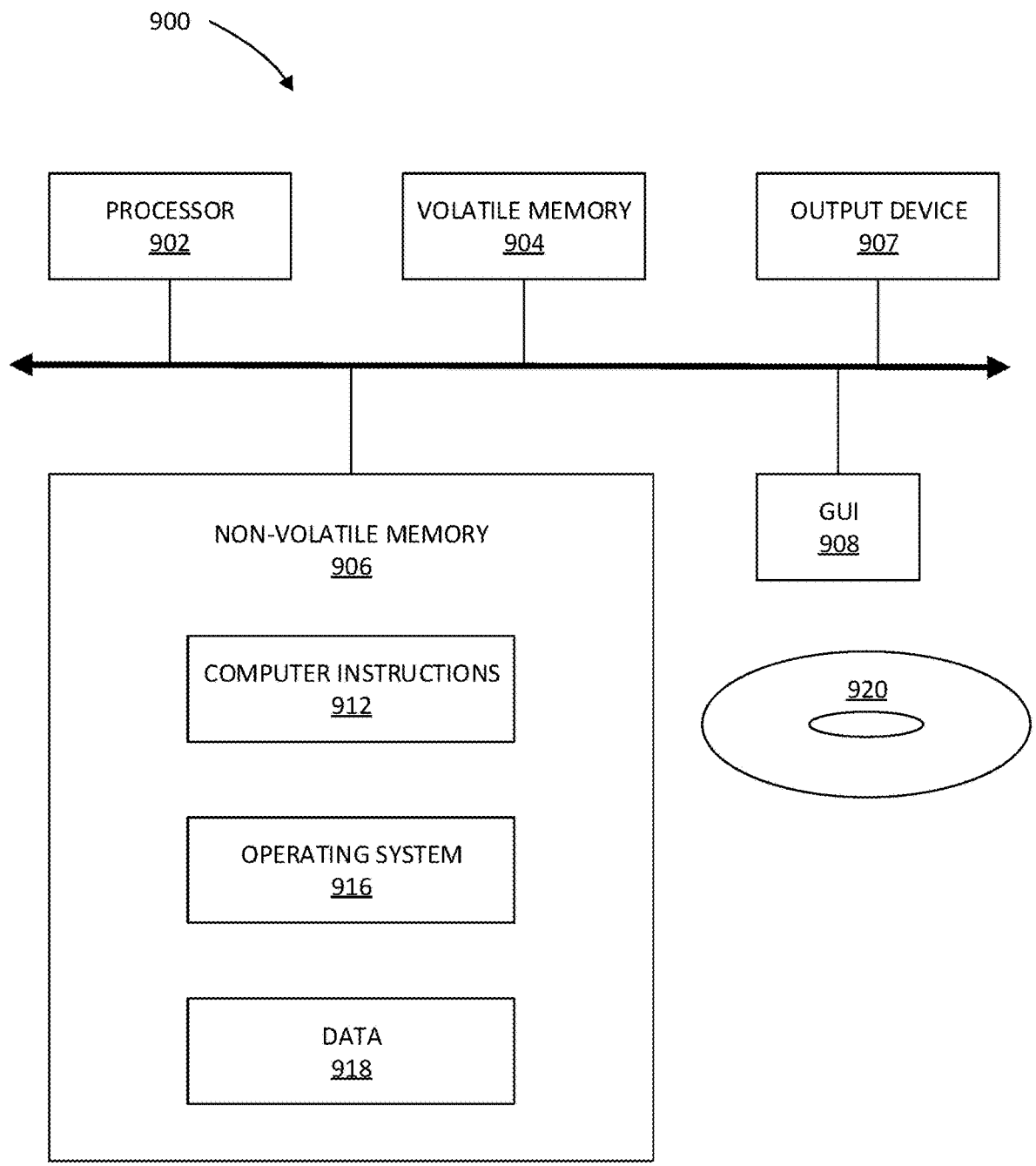
FIG. 9 is a schematic representation of an example computer that can perform at least a portion of the processing described herein.

FIG. 9 shows an exemplary computer 900 that can perform at least part of the processing described herein. The computer 900 includes a processor 902, a volatile memory 904, a non-volatile memory 906 (e.g., hard disk), an output device 907 and a graphical user interface (GUI) 908 (e.g., a mouse, a keyboard, a display, for example). The non-volatile memory 906 stores computer instructions 912, an operating system 916 and data 918. In one example, the computer instructions 912 are executed by the processor 902 out of volatile memory 904. In one embodiment, an article 920 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., RAM/ROM, CD-ROM, hard disk, or magnetic diskette) that is readable by a general or special purpose programmable computer for configuring and operating the computer when the storage medium or device is read by the computer.

Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array), a general purpose graphical processing units (GPGPU), and/or an ASIC (application-specific integrated circuit)).

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims.

All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method, comprising:
applying harmonic compensation on sine and cosine signals for possible mechanical angles, the sine and cosine signals being generated by sensing elements in response to a magnetic field associated with a target;
analyzing results of the applied harmonic compensation;
selecting one of the mechanical angles for harmonic compensation of the sine and cosine signals based on the results of the applied harmonic compensation; and
after one of the mechanical angles is selected, applying harmonic compensation on at least one of the sine and cosine signals based on the selected mechanical angle, and using the sine and cosine signals to detect at least one of a current angular position of the target and a characteristic of movement of the target,
wherein the possible mechanical angles are defined by $$\theta m = \frac{\theta el}{N} + k*360/N$$

where k can vary from 0 to N−1, θm refers to mechanical angle, θel refers to electrical angle, and N refers to a number of teeth on the target.

2. The method according to claim 1, wherein the sensing elements comprise inductive sensing elements.

3. The method according to claim 2, wherein the sine and cosine signals are generated by a transmit coil and at least two receiving coils.

4. The method according to claim 1, wherein the sensing elements comprise magnetic sensing elements.

5. The method according to claim 1, wherein analyzing the results includes using a cost function.

6. The method according to claim 5, wherein selecting one of the mechanical angles comprises selecting the mechanical angle with the lowest value from the cost function.

7. The method according to claim 1, wherein applying the harmonic compensation on the sine and cosine signals includes performing a Fourier transform.

8. The method according to claim 1, wherein the harmonic compensation for the mechanical angles is stored.

9. The method according to claim 1, further including determining the harmonic compensation information over at least one mechanical revolution of the target at constant speed and/or using an absolute angle reference.

10. The method according to claim 1, wherein the sensing elements comprise part of a multi-pole angle sensor IC package.

11. The method according to claim 10, wherein the sensor IC package comprises an inductive eddy current angle sensor.

12. The method according to claim 1, wherein the results of the applied harmonic compensation include amplitudes of undesired harmonic components.

13. The method of claim 1, wherein using the at least one of the compensated sine and cosine signals to detect a current mechanical angle of the target includes one of calculating the current mechanical angle of the target based on the at least one of the compensated sine and cosine signals or providing the at least one of the compensated sine and cosine signals to an external device that is configured to calculate the current mechanical angle of the target.

14. A system, comprising:
an integrated circuit (IC) package including circuitry to:
receive sine and cosine signals that are generated by sensing elements in response to a magnetic field associated with a target;
apply harmonic compensation on the sine and cosine signals for possible mechanical angles;
analyze results of the applied harmonic compensation;
select one of the mechanical angles for harmonic compensation of the sine and cosine signals based on the results of the applied harmonic compensation; and
after one of the mechanical angles is selected, apply harmonic compensation on at least one of the sine and cosine signals based on the selected mechanical angle, and use the sine and cosine signals to detect at least one of a current angular position of the target and a characteristic of movement of the target, $$\theta m = \frac{\theta el}{N} + k*360/N,$$

where k can vary from 0 to N−1, θm refers to mechanical angle, θel refers to electrical angle, and N refers to a number of teeth on the target.

15. The system according to claim 14, wherein the sensing elements comprise inductive sensing elements.

16. The system according to claim 15, wherein the sine and cosine signals are generated by a transmit coil and at least two receiving coils.

17. The system according to claim 14, wherein the sensing elements comprise magnetic field sensing elements.

18. The system according to claim 14, wherein the results are analyzed using a cost function.

19. The system according to claim 18, wherein one of the mechanical angles is selected based on a lowest value from the cost function.

20. The system according to claim 14, wherein applying the harmonic compensation on the sine and cosine signals includes performing a Fourier transform.

21. The system according to claim 14, wherein the harmonic compensation for the mechanical angles is stored.

22. The system according to claim 14, wherein the harmonic compensation information is determined over at least one mechanical revolution of the target at constant speed and/or using an absolute angle reference.

23. The system according to claim 14, wherein the sensing elements comprise part of a multi-pole angle sensor IC package.

24. The system according to claim 23, wherein the sensor IC package comprises an inductive eddy current angle sensor.

25. The system according to claim 14, wherein the results of the applied harmonic compensation include amplitudes of undesired harmonic components.

26. The system according to claim 14, further including a sensor IC package containing the sensing elements, wherein the sensor IC package is coupled to the IC package.

27. The system according to claim 26, wherein the IC package comprises an engine control unit.

28. The system of claim 14, wherein using the at least one of the compensated sine and cosine signals to detect a current mechanical angle of the target includes one of calculating the current mechanical angle of the target based on the at least one of the compensated sine and cosine signals or providing the at least one of the compensated sine and cosine signals to an external device that is configured to calculate the current mechanical angle of the target.

29. A system, comprising:
  means for receiving sine and cosine signals that are generated by sensing elements in response to a magnetic field associated with a target; and
  means for processing the sine and cosine signals including:
    applying harmonic compensation on the sine and cosine signals for possible mechanical angles;
    analyzing results of the applied harmonic compensation;
    selecting one of the mechanical angles for harmonic compensation of the sine and cosine signals based on the results of the applied harmonic compensation; and
    after one of the mechanical angles is selected, applying harmonic compensation on at least one of the sine and cosine signals based on the selected mechanical angle, and use the sine and cosine signals to detect at least one of a current angular position of the target and a characteristic of movement of the target,
  wherein the possible mechanical angles are defined by $$\theta m = \frac{\theta el}{N} + k*360/N$$

where k can vary from 0 to N−1, θm refers to mechanical angle, θel refers to electrical angle, and N refers to a number of teeth on the target.

* * * * *

UNITED STATES PATENT AND TRADEMARK OFFICE
CERTIFICATE OF CORRECTION

| | | |
|---|---|---|
| PATENT NO. | : 11,733,316 B2 | Page 1 of 1 |
| APPLICATION NO. | : 17/120395 | |
| DATED | : August 22, 2023 | |
| INVENTOR(S) | : Emanuele Andrea Casu and Andrea Foletto | |

It is certified that error appears in the above-identified patent and that said Letters Patent is hereby corrected as shown below:

In the Specification

Column 1, Line 52, delete "θel=a tan 2" and replace with --θel=atan2--.

In the Claims

Column 10, Claim 14, after Line 25, insert the following text --wherein the possible mechanical angles are defined by--.

Signed and Sealed this
Twenty-fifth Day of February, 2025

Coke Morgan Stewart
*Acting Director of the United States Patent and Trademark Office*